(12) United States Patent
Oogushi et al.

(10) Patent No.: US 11,270,929 B2
(45) Date of Patent: Mar. 8, 2022

(54) SEMICONDUCTOR DEVICE

(71) Applicant: Mitsubishi Electric Corporation, Tokyo (JP)

(72) Inventors: Naohiro Oogushi, Tokyo (JP); Ryoji Murai, Fukuoka (JP); Takahiko Murakami, Fukuoka (JP)

(73) Assignee: Mitsubishi Electric Corporation, Tokyo (JP)

(*) Notice: Subject to any disclaimer, the term of this patent is extended or adjusted under 35 U.S.C. 154(b) by 11 days.

(21) Appl. No.: 16/755,488

(22) PCT Filed: Jan. 5, 2018

(86) PCT No.: PCT/JP2018/000109
§ 371 (c)(1),
(2) Date: Apr. 10, 2020

(87) PCT Pub. No.: WO2019/135284
PCT Pub. Date: Jul. 11, 2019

(65) Prior Publication Data
US 2021/0225743 A1 Jul. 22, 2021

(51) Int. Cl.
*H01L 23/495* (2006.01)
*H01L 21/66* (2006.01)
(Continued)

(52) U.S. Cl.
CPC ........ *H01L 23/49551* (2013.01); *H01L 22/30* (2013.01); *H01L 23/36* (2013.01); *H01L 25/04* (2013.01)

(58) Field of Classification Search
CPC ... H01L 23/36; H01L 23/367; H01L 23/3675; H01L 23/3736; H01L 23/40;
(Continued)

(56) References Cited

U.S. PATENT DOCUMENTS

| 4,754,912 A * | 7/1988 | Burns | H01L 24/83 228/164 |
| 2007/0278664 A1* | 12/2007 | Carney | H01L 24/37 257/706 |

(Continued)

FOREIGN PATENT DOCUMENTS

| JP | H0951058 A | 2/1997 |
| JP | 2014204006 A | 10/2014 |

(Continued)

OTHER PUBLICATIONS

International Search Report; Written Opinion; and Notification of Transmittal of the International Search Report and the Writtenn Opinion of the International Searching Authority, or the Declaration issued in PCT/JP2018/000109; dated Mar. 13, 2018.

(Continued)

*Primary Examiner* — Eduardo A Rodela
(74) *Attorney, Agent, or Firm* — Studebaker & Brackett PC

(57) ABSTRACT

A semiconductor chip (6) having flexibility is bonded to a heat radiation material (4) with solder. The semiconductor chip (6) is pressed by a tip of a pressing member (9,11) from an upper side. As a result, convex warpage of the semiconductor chip (6) can be suppressed. Furthermore, since voids can be prevented from remaining in the solder (7), the heat radiation of the semiconductor device can be enhanced.

15 Claims, 9 Drawing Sheets

(51) Int. Cl.
*H01L 23/36* (2006.01)
*H01L 25/04* (2014.01)

(58) Field of Classification Search
CPC .......... H01L 23/4093; H01L 23/49541; H01L 23/49548; H01L 23/49551; H01L 23/49568; H01L 23/49838; H01L 24/34; H01L 24/40; H01L 2224/40157; H01L 2224/84; H01L 2224/84007; H01L 25/04; H01L 22/30

See application file for complete search history.

(56) References Cited

U.S. PATENT DOCUMENTS

| | | | | |
|---|---|---|---|---|
| 2008/0246130 | A1* | 10/2008 | Carney | H01L 23/49568 257/675 |
| 2010/0133670 | A1* | 6/2010 | Liu | H01L 23/49524 257/675 |
| 2014/0299979 | A1* | 10/2014 | Dan | H01L 24/97 257/675 |
| 2014/0312360 | A1* | 10/2014 | Otremba | H01L 21/50 257/77 |
| 2015/0115282 | A1 | 4/2015 | Takahashi et al. | |
| 2015/0221581 | A1* | 8/2015 | Tamura | H01L 23/3142 257/676 |
| 2016/0293473 | A1* | 10/2016 | Yoshihara | H01L 23/49582 |
| 2017/0200704 | A1 | 7/2017 | Kodaira | |
| 2018/0151711 | A1* | 5/2018 | Yamada | H01L 29/0804 |
| 2018/0174951 | A1* | 6/2018 | Fan | H01L 23/49562 |
| 2018/0240770 | A1* | 8/2018 | Choi | H01L 23/49575 |
| 2018/0301422 | A1* | 10/2018 | Yamauchi | H01L 23/3107 |
| 2020/0043887 | A1* | 2/2020 | Ogawa | H01L 23/057 |

FOREIGN PATENT DOCUMENTS

| | | |
|---|---|---|
| JP | 2015050340 A | 3/2015 |
| JP | 2015088653 A | 5/2015 |
| WO | 2016163237 A1 | 10/2016 |

OTHER PUBLICATIONS

An Office Action; "Notice of Reasons for Refusal," mailed by the Japanese Patent Office dated Apr. 13, 2021, which corresponds to Japanese Patent Application No. 2019-563730 and is related to U.S. Appl. No. 16/755,488; with English language translation.

* cited by examiner

SEMICONDUCTOR DEVICE

FIELD

The present disclosure relates to a semiconductor device.

BACKGROUND

In a power semiconductor device, a lower surface of a semiconductor chip is connected to a cooling mechanism via solder, a heat radiation material, and an insulating material in order to efficiently dissipate heat generated by energization. An upper surface of the semiconductor chip is connected to a lead frame via solder.

In order to suppress the loss of semiconductor chips caused by increase in current capacity of power semiconductor devices, the thicknesses of the semiconductor chips have been as thin as about 50 to 160 μm. Furthermore, in order to improve heat radiation performance, the area of a semiconductor chip has increased. Therefore, there is a problem that semiconductor chips are deformed and warped. In order to suppress warpage of a semiconductor chip, it has been proposed that the semiconductor chip is pressed from an upper side by a collet and soldered to a heat radiation material (for example, see Patent Literature 1).

CITATION LIST

Patent Literature

[PTL 1] JP H9-51058 A

SUMMARY

Technical Problem

However, there is a problem that solder on a lower surface of the chip is melted in a heating step after bonding of the chip such as a step of soldering a lead frame to an upper surface of the chip, and the semiconductor chip is warped again. The warpage of the semiconductor chip causes voids to be trapped in the solder between the semiconductor chip and the heat radiation material, and the solder solidifies under that state, which causes a problem that heat radiation of the semiconductor device is impaired.

The present invention has been made to solve the above-described problem, and has an object to obtain a semiconductor device capable of suppressing warpage of a semiconductor chip and enhancing heat radiation.

Solution to Problem

A semiconductor device according to the present disclosure includes: a heat radiation material; a semiconductor chip having flexibility and bonded to the heat radiation material with solder; and a pressing member having a tip pressing the semiconductor chip from an upper side.

Advantageous Effects of Invention

In the present disclosure, the semiconductor chip is pressed from the upper side by the tip of the pressing member. As a result, convex warpage of the semiconductor chip can be suppressed. Furthermore, since voids can be prevented from remaining in the solder, the heat radiation of the semiconductor device can be enhanced.

DESCRIPTION OF EMBODIMENTS

A semiconductor device according to the embodiments of the present disclosure will be described with reference to the drawings. The same components will be denoted by the same symbols, and the repeated description thereof may be omitted.

First Embodiment

Figure 1:
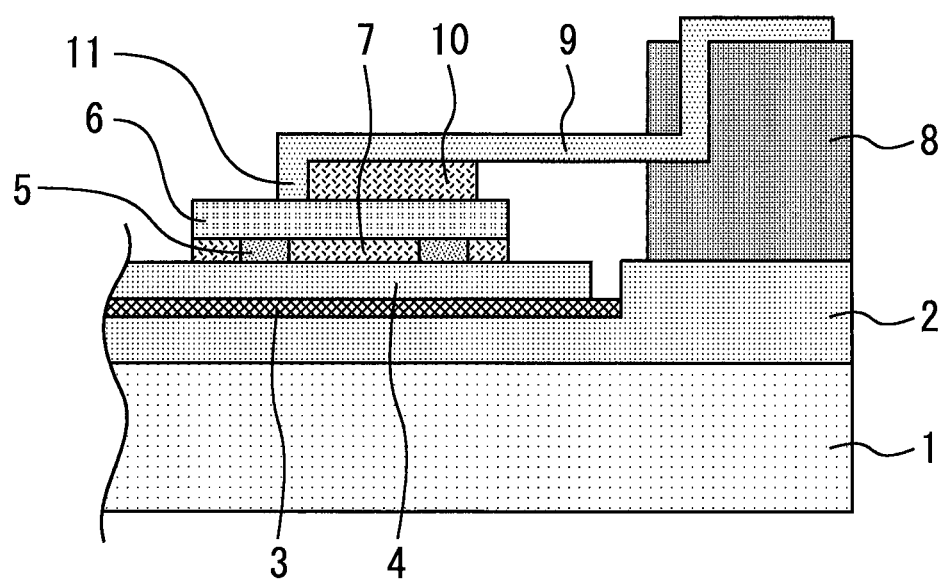
FIG. 1 is a cross-sectional view showing a semiconductor device according to a first embodiment.

FIG. 1 is a cross-sectional view showing a semiconductor device according to a first embodiment. A heat radiation material 2, an insulating material 3, and a heat radiation material 4 are successively arranged in order on a cooling mechanism 1. A semiconductor chip 6 is mounted on the heat radiation material 4 via a bump 5, and the semiconductor chip 6 is bonded to the heat radiation material 4 with solder 7.

A case 8 surrounding the semiconductor chip 6 is provided on the heat radiation material 2. A tip of a lead frame 9 is bonded to an upper surface of the semiconductor chip 6 with solder 10. A base of the lead frame 9 is fixed to the case 8. A protrusion 11 is provided on the lower surface of the tip of the lead frame 9. Here, the protrusion 11 is formed by bending the tip of the lead frame 9 toward the semiconductor chip 6 by 90 degrees, and directly contacts the upper surface of the semiconductor chip 6 without the solder 10 interposed therebetween.

Figure 2:
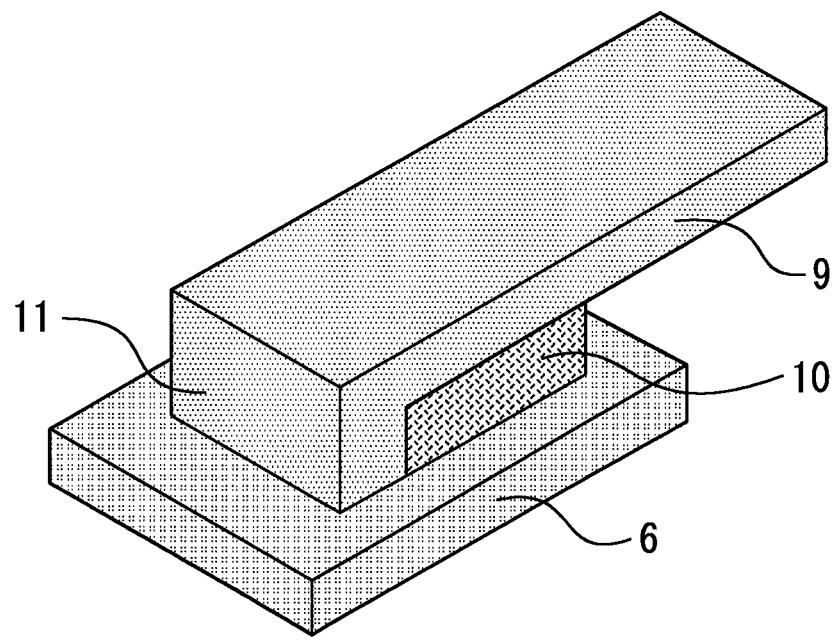
FIG. 2 is a perspective view showing the tip of the lead frame of the semiconductor device according to the first embodiment.
Figure 3:
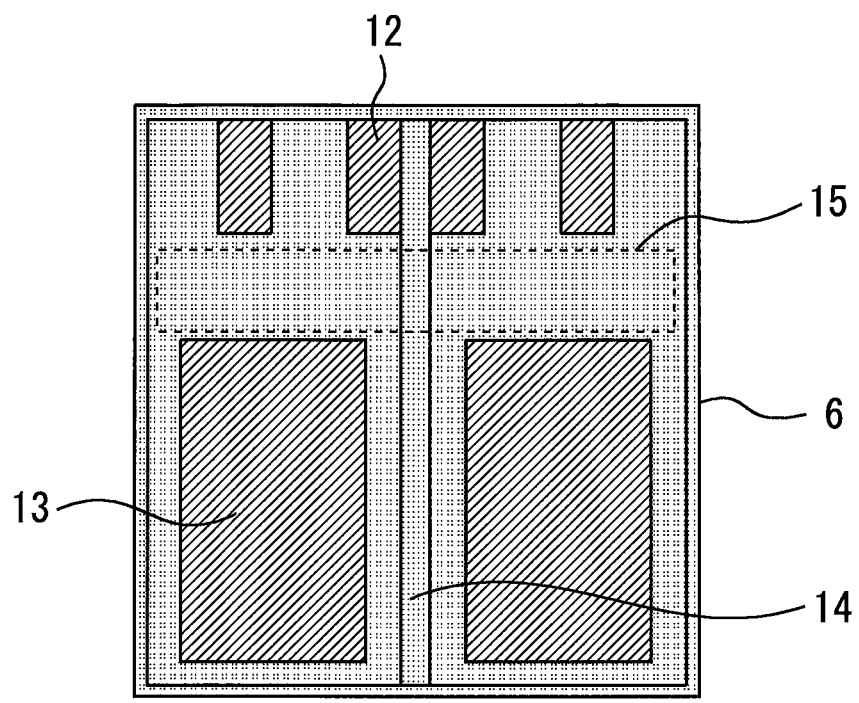
FIG. 3 is a plan view showing the upper surface of the semiconductor chip.

FIG. 2 is a perspective view showing the tip of the lead frame of the semiconductor device according to the first embodiment. FIG. 3 is a plan view showing the upper surface of the semiconductor chip. A gate electrode 12 and an emitter electrode 13 which are apart from each other are provided on the upper surface of the semiconductor chip 6. A temperature sensing circuit 14 is provided at the center of the upper surface of the semiconductor chip 6.

A collector electrode is formed on the entire lower surface of the semiconductor chip 6, whereas a portion having no electrode is present on the upper surface, so that the semiconductor chip 6 warps in a convex state in a region 15 having no electrode. Therefore, the region 15 having no electrode on the upper surface of the semiconductor chip 6 is pressed by the protrusion 11 at the tip of the lead frame 9. Since the semiconductor chip 6 has a thickness of 50 to 160 µm and has flexibility, the semiconductor chip 6 is easily deformed by pressing.

Figure 4:
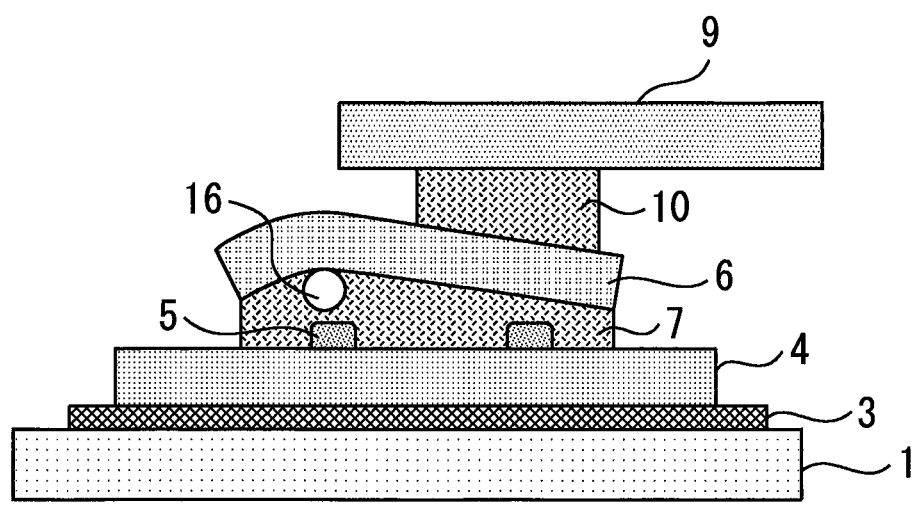
FIG. 4 is a cross-sectional view showing a semiconductor device according to the comparative example.

Subsequently, an effect of the present embodiment will be described in comparison with a comparative example. FIG. 4 is a cross-sectional view showing a semiconductor device according to the comparative example. The comparative example does not have the protrusion 11 for pressing the semiconductor chip 6 from an upper side, which causes the semiconductor chip 6 to warp. As a result, a void 16 is trapped in the solder 7 and the heat radiation of the semiconductor device is impaired.

In contrast, in the present embodiment, the semiconductor chip 6 is pressed from the upper side by the protrusion 11 at the tip of the lead frame 9. As a result, convex warpage of the semiconductor chip 6 can be suppressed. Furthermore, since voids can be prevented from remaining in the solder 7, the heat radiation of the semiconductor device can be enhanced.

Second Embodiment

Figure 5:
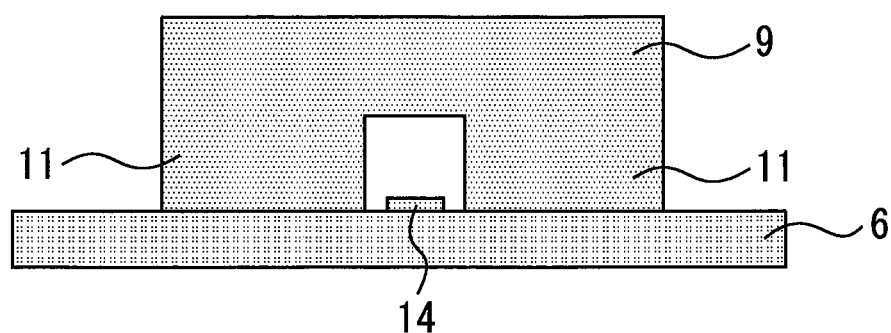
FIG. 5 is a cross-sectional view showing a tip of a lead frame of a semiconductor device according to a second embodiment.
Figure 6:
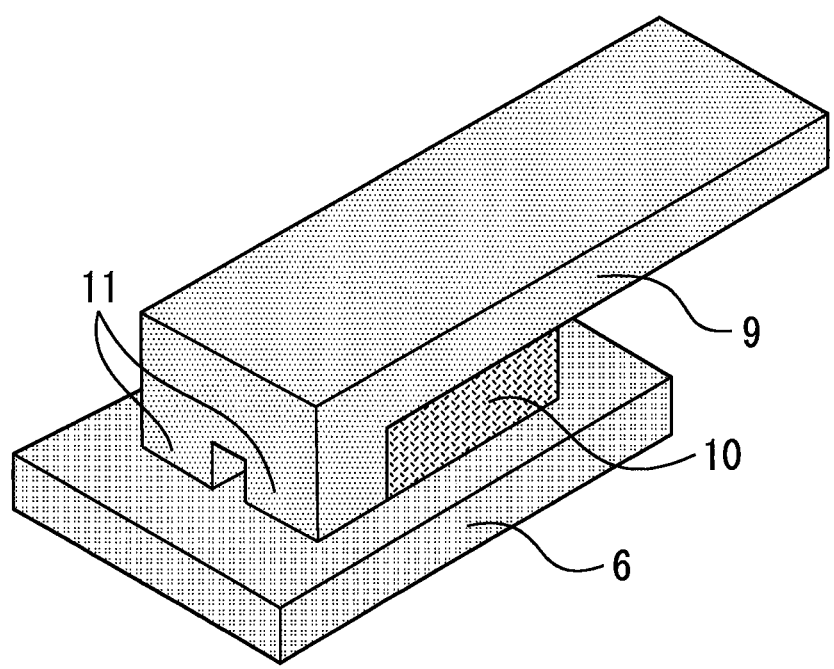
FIG. 6 is a perspective view showing the tip of the lead frame of the semiconductor device according to the second embodiment.

FIG. 5 is a cross-sectional view showing a tip of a lead frame of a semiconductor device according to a second embodiment. FIG. 6 is a perspective view showing the tip of the lead frame of the semiconductor device according to the second embodiment. A protrusion 11 at the tip of the lead frame 9 has a bifurcated shape, and presses the semiconductor chip 6 while avoiding the temperature sensing circuit 14. As a result, the temperature sensing circuit 14 can be protected.

Third Embodiment

Figure 7:
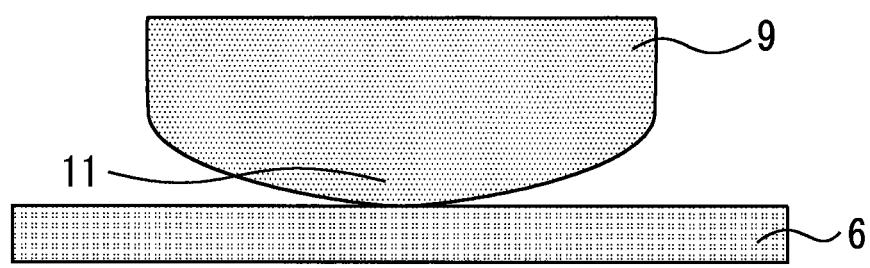
FIG. 7 is a side view showing a tip of a lead frame of a semiconductor device according to a third embodiment.

FIG. 7 is a side view showing a tip of a lead frame of a semiconductor device according to a third embodiment. A protrusion 11 at the tip of the lead frame 9 has an arc shape. As a result, even when the semiconductor chip 6 is pressed down with the lead frame 9 being inclined, the semiconductor chip 6 can be prevented from being inclined.

Fourth Embodiment

Figure 8:
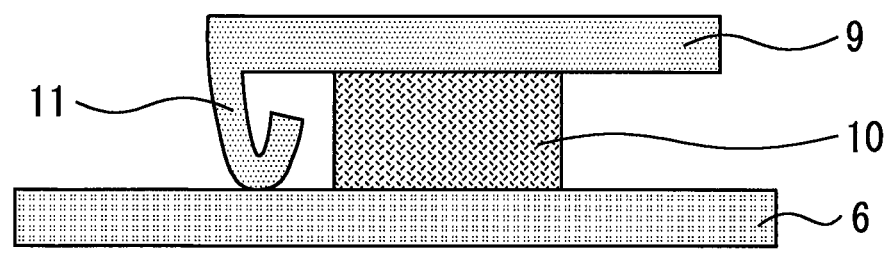
FIG. 8 is a side view showing a tip of a lead frame of a semiconductor device according to a fourth embodiment.

FIG. 8 is a side view showing a tip of a lead frame of a semiconductor device according to a fourth embodiment. A protrusion 11 at the tip of the lead frame 9 has a shape having spring performance. As a result, even when the height of the lead frame 9 varies greatly, the semiconductor chip 6 can be pressed with a constant load.

Fifth Embodiment

Figure 9:
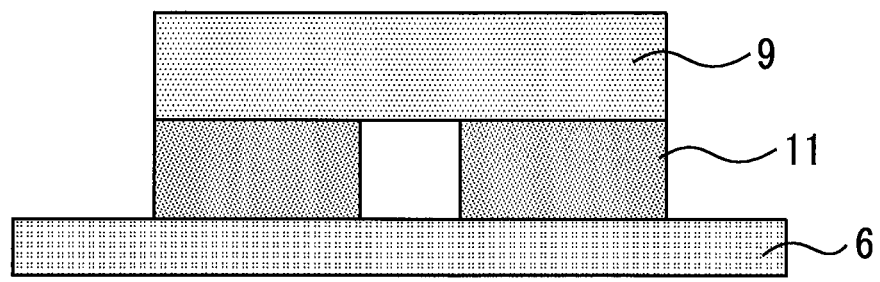
FIG. 9 is a side view showing a tip of a lead frame of a semiconductor device according to a fifth embodiment.

FIG. 9 is a side view showing a tip of a lead frame of a semiconductor device according to a fifth embodiment. A protrusion 11 is a separate part from the lead frame 9 and is made of resin having a lower hardness than the material of the semiconductor chip 6 such as Si or SiC, which makes it possible to prevent the upper surface of the semiconductor chip 6 from being scratched.

Sixth Embodiment

Figure 10:
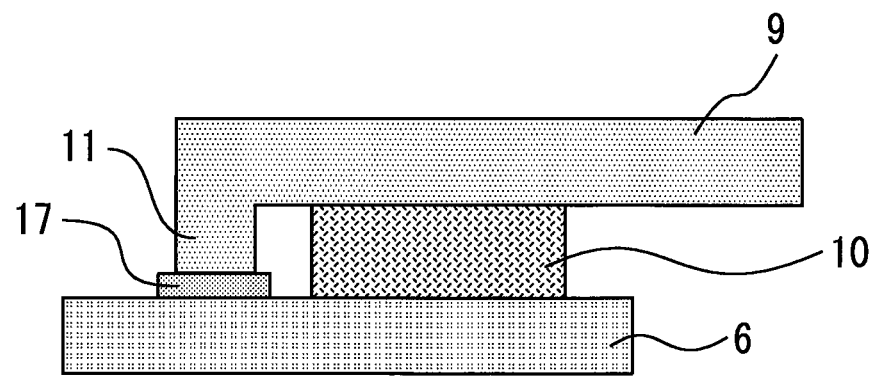
FIG. 10 is a side view showing a tip of a lead frame of a semiconductor device according to a sixth embodiment.
Figure 11:
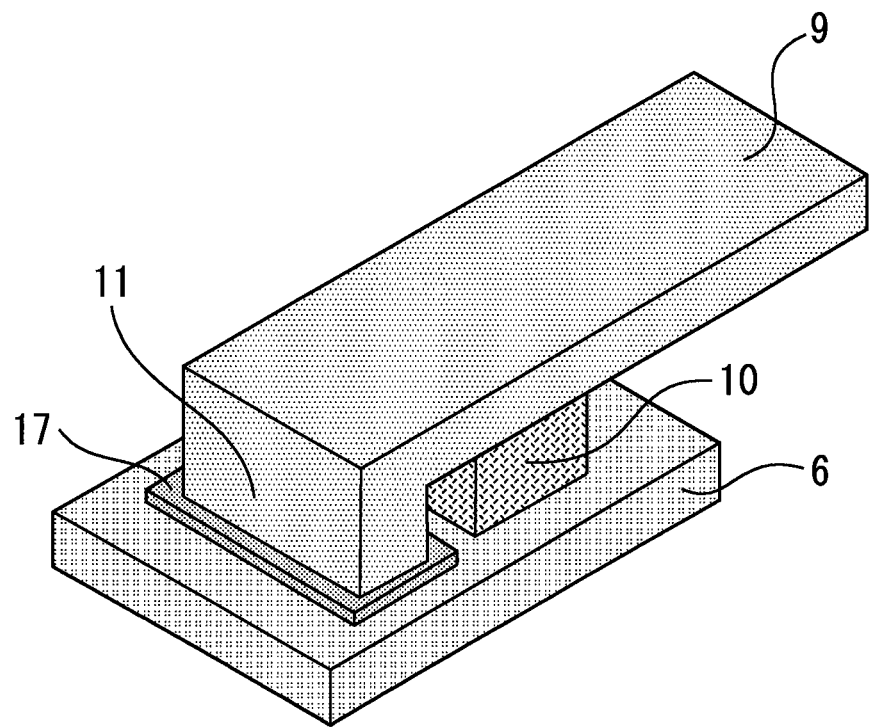
FIG. 11 is a perspective view showing the tip of the lead frame of the semiconductor device according to the sixth embodiment.

FIG. 10 is a side view showing a tip of a lead frame of a semiconductor device according to a sixth embodiment. FIG. 11 is a perspective view showing the tip of the lead frame of the semiconductor device according to the sixth embodiment. A buffer material 17 is provided between a protrusion 11 and a semiconductor chip 6. The buffer material 17 is resin such as polyimide used when the semiconductor chip 6 is manufactured. The buffer material 17 can prevent rubbing between the lead frame 9 and the semiconductor chip 6, and reduce damage to the semiconductor chip by thermal cycling.

Seventh Embodiment

Figure 12:
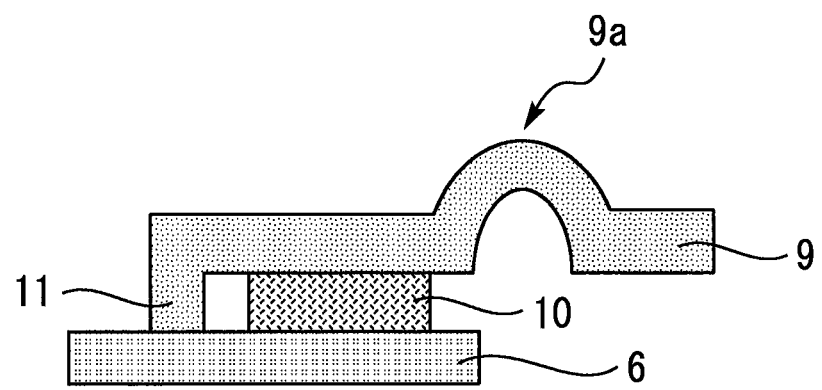
FIG. 12 is a side view showing a tip of a lead frame of a semiconductor device according to a seventh embodiment.
Figure 13:
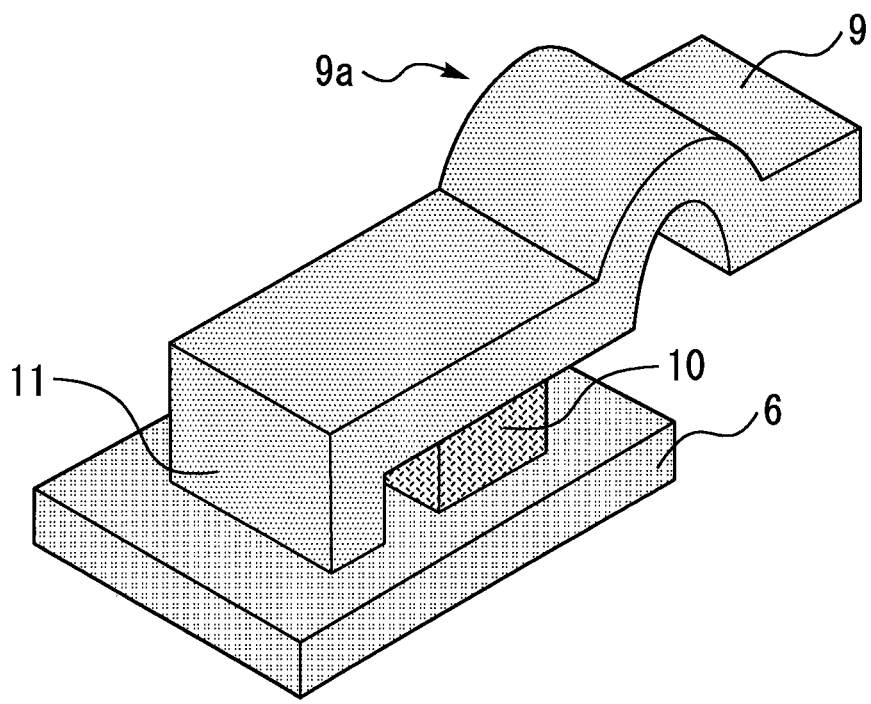
FIG. 13 is a perspective view showing the tip of the lead frame of the semiconductor device according to the seventh embodiment.

FIG. 12 is a side view showing a tip of a lead frame of a semiconductor device according to a seventh embodiment. FIG. 13 is a perspective view showing the tip of the lead frame of the semiconductor device according to the seventh embodiment. A part of the lead frame 9 has a spring-like shape 9a. As a result, the stress on the semiconductor chip 6 can be reduced.

Eighth Embodiment

Figure 14:
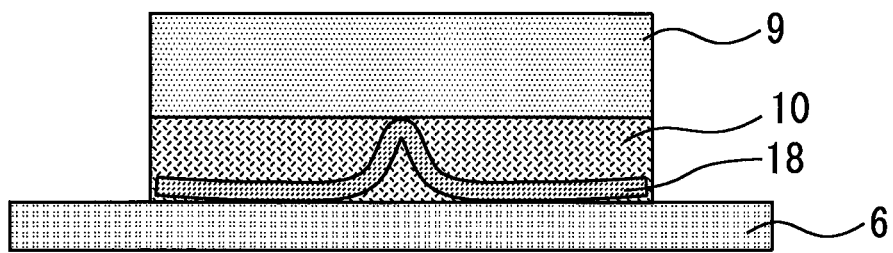
FIG. 14 is a cross-sectional view showing a tip of a lead frame of a semiconductor device according to an eighth embodiment.

FIG. 14 is a cross-sectional view showing a tip of a lead frame of a semiconductor device according to an eighth embodiment. A lead frame 9 and a semiconductor chip 6 are soldered to each other with a spacer 18 having spring performance being interposed therebetween. Since the semiconductor chip 6 is pressed through the spacer 18, even when the height of the lead frame 9 varies, the semiconductor chip 6 can be pressed uniformly.

Ninth Embodiment

Figure 15:
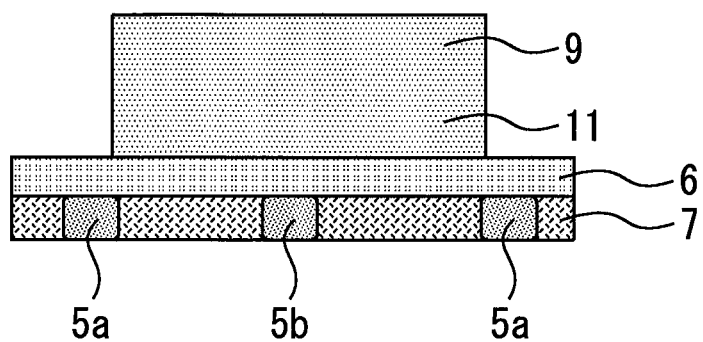
FIG. 15 is a cross-sectional view showing a tip of a lead frame of a semiconductor device according to a ninth embodiment.

FIG. 15 is a cross-sectional view showing a tip of a lead frame of a semiconductor device according to a ninth embodiment. First bumps 5a are arranged between four corners of the lower surface of a semiconductor chip 6 and a heat radiation material 4. A second bump 5b is arranged between the center of the lower surface of the semiconductor chip 6 and the heat radiation material 4. The height of the second bump 5b is set to be lower than the height of the first bumps 5a. As a result, when the semiconductor chip 6 is pressed down, the semiconductor chip 6 has a downward convex shape, and the thickness of the thinnest portion of the solder 10 can be guaranteed by the height of the second bump 5b. The other configurations and effects are similar to those of the first embodiment and the like.

Tenth Embodiment

Figure 16:
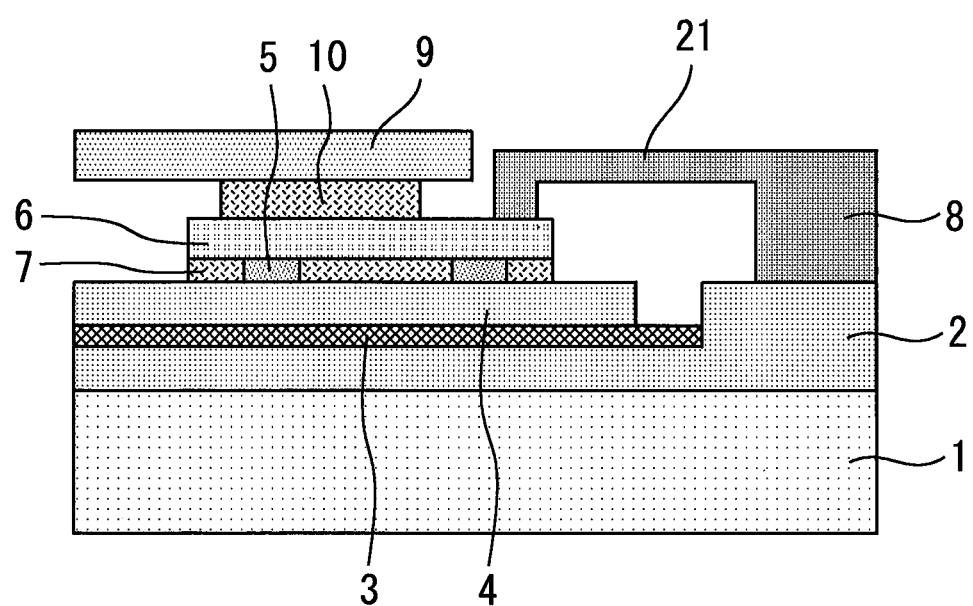
FIG. 16 is a cross-sectional view showing a semiconductor device according to a tenth embodiment.
Figure 17:
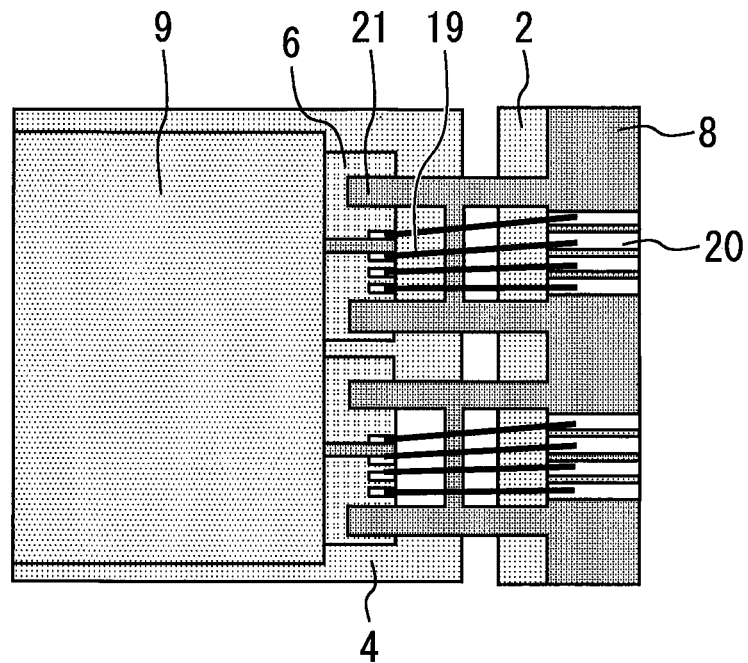
FIG. 17 is a plan view showing the semiconductor device according to the tenth embodiment.

FIG. 16 is a cross-sectional view showing a semiconductor device according to a tenth embodiment. FIG. 17 is a plan view showing the semiconductor device according to the tenth embodiment. A plurality of semiconductor chips 6 are arranged side by side. A case 8 has a plurality of relay terminals 20 to be connected to the plurality of semiconductor chips 6 by wires 19, respectively. The case 8 is provided with press beams 21. Instead of the lead frame 9 of the first embodiment and the like, the press beams 21 function as pressing members for pressing the semiconductor chip 6 from the upper side. The press beams 21 integrated with the case 8 as described above can be formed by changing the shape of the case 8.

Eleventh Embodiment

Figure 18:
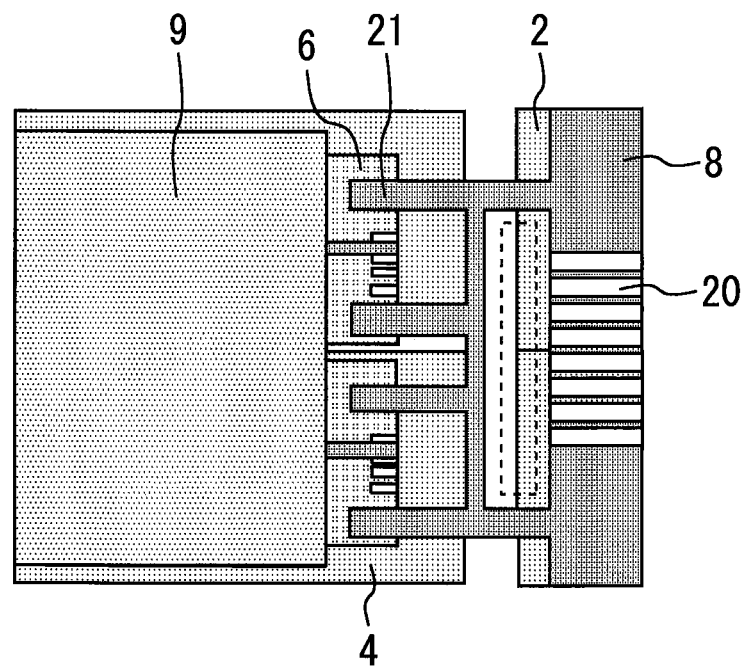
FIG. 18 is a plan view showing a semiconductor device according to an eleventh embodiment.

FIG. 18 is a plan view showing a semiconductor device according to an eleventh embodiment. A plurality of relay terminals 20 to be connected to a plurality of semiconductor chips 6 by wires, respectively, are clustered and arranged side by side. As a result, the distance between the relay terminals 20 is shorter than that in the tenth embodiment in which the plurality of relay terminals 20 are arranged while separated into two groups, and a control board can be miniaturized. The other configurations and effects are similar to those of the tenth embodiment.

The press beams 21 are configured to protrude from the case 8 toward the semiconductor chip 6 on both sides of the cluster of the plurality of relay terminals 20. In this case, as indicated by a broken line in FIG. 18, a space in which a blade is inserted for lead cutting of the plurality of relay terminals 20 is required.

The semiconductor chip 6 is not limited to a semiconductor chip formed of silicon, but instead may be formed of a wide-bandgap semiconductor having a bandgap wider than that of silicon. The wide-bandgap semiconductor is, for example, a silicon carbide, a gallium-nitride-based material, or diamond. The semiconductor chip 6 formed of such a wide-bandgap semiconductor has a high voltage resistance and a high allowable current density, and thus can be miniaturized. The use of such a miniaturized semiconductor chip 6 enables the miniaturization and high integration of the semiconductor device in which the semiconductor chip 6 is incorporated. Further, since the semiconductor chip 6 has a high heat resistance, a radiation fin of a heatsink can be miniaturized and a water-cooled part can be air-cooled, which leads to further miniaturization of the semiconductor device. Further, since the semiconductor chip 6 has a low power loss and a high efficiency, a highly efficient semiconductor device can be achieved.

REFERENCE SIGNS LIST

4 heat radiation material; 5*a* first bump; 5*b* second bump; 6 semiconductor chip; 7,10 solder; 8 case; 9 lead frame (pressing member); 9*a* spring-like shape; 11 protrusion (pressing member); 12 gate electrode (electrode); 13 emitter electrode (electrode); 14 temperature sensing circuit; 17 buffer material; 18 spacer; 20 relay terminal; 21 press beam (pressing member)

The invention claimed is:

1. A semiconductor device comprising:
   a heat radiation material;
   a semiconductor chip having flexibility and bonded to the heat radiation material with solder; and
   a lead frame having a protrusion, an end surface of the protrusion directly pressing the semiconductor chip from an upper side, wherein
   a width of the protrusion is the same as a thickness of the lead frame, and
   a portion of the lead frame adjacent to the protrusion is bonded to the upper side of the semiconductor chip with solder.

2. The semiconductor device according to claim 1, further comprising a case surrounding the semiconductor chip,
   wherein a base of the lead frame is fixed to the case.

3. The semiconductor device according to claim 2, wherein the lead frame is a press beam provided with the case.

4. The semiconductor device according to claim 3, wherein the semiconductor chip includes a plurality of chips arranged side by side,
   the case has a plurality of relay terminals connected to the plurality of chips by wires respectively, clustered and arranged side by side, and
   the press beam is configured to protrude from the case toward the semiconductor chip on both sides of a cluster of the plurality of relay terminals.

5. The semiconductor device according to claim 1, wherein a plurality of electrodes apart from each other are provided on an upper surface of the semiconductor chip, and
   the lead frame presses a region not having the plurality of electrodes on the upper surface of the semiconductor chip.

6. The semiconductor device according to claim 1, wherein a part of the lead frame has a spring-like shape.

7. The semiconductor device according to claim 1, further comprising a spacer having spring performance and interposed between the lead frame and the semiconductor chip.

8. The semiconductor device according to claim 1, further comprising a first bump arranged between four corners of a lower surface of a semiconductor chip and the heat radiation material, and a second bump arranged between a center of the lower surface of the semiconductor chip and the heat radiation material,
   wherein a height of the second bump is lower than a height of the first bump.

9. The semiconductor device according to claim 1, wherein the semiconductor chip is made of a wide-band-gap semiconductor.

10. A semiconductor device comprising:
    a heat radiation material;
    a semiconductor chip having flexibility and bonded to the heat radiation material with solder; and
    a lead frame having a protrusion, an end surface of the protrusion pressing the semiconductor chip from an upper side, wherein
    a width of the protrusion is the same as a thickness of the lead frame, and
    a portion of the lead frame adjacent to the protrusion is bonded to the upper side of the semiconductor chip with solder, and
    a buffer material is provided between the protrusion of the lead frame and the semiconductor chip.

11. A semiconductor device comprising:
    a heat radiation material;
    a semiconductor chip having flexibility and bonded to the heat radiation material with solder; and
    a lead frame having a protrusion pressing the semiconductor chip from an upper side, wherein
    a plurality of electrodes apart from each other are provided on an upper surface of the semiconductor chip, and
    the lead frame presses a region not having the plurality of electrodes on the upper surface of the semiconductor chip, wherein
    a width of the protrusion is the same as a thickness of the lead frame, and
    a portion of the lead frame adjacent to the protrusion is bonded to the upper side of the semiconductor chip with solder.

12. A semiconductor device comprising:
    a heat radiation material;
    a semiconductor chip having flexibility and bonded to the heat radiation material with solder; and
    a lead frame having a protrusion pressing the semiconductor chip from an upper side, wherein
    the protrusion is provided on a lower surface of a tip of the lead frame,
    a temperature sensing circuit is provided at a center of an upper surface of the semiconductor chip, and the protrusion has a bifurcated shape and presses the semiconductor chip while avoiding the temperature sensing circuit, wherein a width of the protrusion is the same as a thickness of the lead frame, and a portion of the lead frame adjacent to the protrusion is bonded to the upper side of the semiconductor chip with solder.

13. A semiconductor device comprising:

a heat radiation material;

a semiconductor chip having flexibility and bonded to the heat radiation material with solder; and a lead frame having a protrusion pressing the semiconductor chip from an upper side, wherein the protrusion is provided on a lower surface of a tip of the lead frame, the protrusion is a separate part from the lead frame and is made of resin having a lower hardness than a material of the semiconductor chip, a width of the protrusion is the same as a thickness of the lead frame, and a portion of the lead frame adjacent to the protrusion is bonded to the upper side of the semiconductor chip with solder.

14. A semiconductor device comprising:

a heat radiation material;

a semiconductor chip having flexibility and bonded to the heat radiation material with solder;

a lead frame having a protrusion pressing the semiconductor chip from an upper side; and a case surrounding the semiconductor chip, wherein a base of the lead frame is fixed to the case, the lead frame is a press beam provided with the case, the semiconductor chip includes a plurality of chips arranged side by side, the case has a plurality of relay terminals connected to the plurality of chips by wires respectively, clustered and arranged side by side, the press beam is configured to protrude from the case toward the semiconductor chip on both sides of a cluster of the plurality of relay terminals, a width of the protrusion is the same as a thickness of the lead frame, and a portion of the lead frame adjacent to the protrusion is bonded to the upper side of the semiconductor chip with solder.

15. A semiconductor device comprising:

a heat radiation material;

a semiconductor chip having flexibility and bonded to the heat radiation material with solder;

a lead frame having a protrusion pressing the semiconductor chip from an upper side; and a first bump arranged between four corners of a lower surface of a semiconductor chip and the heat radiation material, and a second bump arranged between a center of the lower surface of the semiconductor chip and the heat radiation material, wherein a height of the second bump is lower than a height of the first bump, a width of the protrusion is the same as a thickness of the lead frame, and a portion of the lead frame adjacent to the protrusion is bonded to the upper side of the semiconductor chip with solder.

* * * * *